United States Patent [19]

Alessandri et al.

[11] Patent Number: 5,054,834
[45] Date of Patent: Oct. 8, 1991

[54] GRIPPER FOR THE ADVANTAGEOUSLY ROBOTIZED HANDLING OF ONE OR MORE SILICON WAFERS AND/OR OF A SUPPORT FOR SUCH WAFERS

[75] Inventors: Mauro Alessandri; Renzo Carrera; Giulio Iannuzzi, all of Milan, Italy

[73] Assignee: SGS - Thomson Microelectronics S.R.L., Milan, Italy

[21] Appl. No.: 446,196

[22] Filed: Dec. 5, 1989

[30] Foreign Application Priority Data

Dec. 20, 1988 [IT] Italy ............................. 23031 A/88

[51] Int. Cl.5 ...................... B66C 1/62; B25J 9/20
[52] U.S. Cl. ................................ 294/87.1; 294/34; 294/88; 294/907; 901/37; 901/46
[58] Field of Search .................. 294/87.1, 88, 103.1, 294/902, 907, 34; 414/225, 730, 736, 739–741; 901/30, 34, 37, 39, 46, 47

[56] References Cited

U.S. PATENT DOCUMENTS

| | | | |
|---|---|---|---|
| 4,568,234 | 2/1986 | Lee et al. | 294/87.1 X |
| 4,639,028 | 1/1987 | Olson | 294/34 |
| 4,695,217 | 9/1987 | Lau | 294/87.1 X |
| 4,801,168 | 1/1989 | Sato | 294/902 X |
| 4,813,732 | 3/1989 | Klem | 294/103.1 |
| 4,846,626 | 7/1989 | Engelbrecht | 901/47 X |
| 4,900,214 | 2/1990 | Ben | 294/34 X |
| 4,958,982 | 9/1990 | Champet et al. | 294/87.1 X |

*Primary Examiner*—Margaret A. Focarino
*Assistant Examiner*—Dean J. Kramer
*Attorney, Agent, or Firm*—Ladas & Parry

[57] ABSTRACT

A gripper for the advantageously robotized handling of one or more silicon wafers (5) comprises a part (2, 102) which allows the gripper (1, 101) to be secured to an operating arm or other handling member (3), the part (2, 102) being rigid with a support structure (4, 104) for the silicon wafers. The structure (4, 104) comprises at least two mutually cooperating opposing jaws (9, 10; 109, 110) mobile relative to each other; the jaws (9, 10; 109, 110) are provided with at least one seat (16, 116) for adapting to the shape of the lateral edge (17) of the wafer (5) supported by the jaws during its handling. Advantageously, on one side (108) of the wafer support structure (104) there are provided at least two members (174) mobile relative to the side (108) and arranged to cooperate with a silicon wafer holder or boat, to enable this latter to be supported and handled.

7 Claims, 3 Drawing Sheets

5,054,834

GRIPPER FOR THE ADVANTAGEOUSLY ROBOTIZED HANDLING OF ONE OR MORE SILICON WAFERS AND/OR OF A SUPPORT FOR SUCH WAFERS

DESCRIPTION

This invention relates to a gripper for the advantageously robotized handling of at least one silicon wafer.

It is well known that the various operations or treatments to which the wafers are subjected during their preparation (ie the various steps in the diffusion process) must be carried out in very clean environments. As the presence of a human operator can negatively affect the maintenance of such cleanliness, robots or robotized systems are used to convey the wafers from one processing zone to another. These systems for example convey batches of wafers, inserted adjacent to each other in suitable known holders or "boats" from one treatment station to another.

During the execution of said process steps there is also the need to check that all wafers undergo the same treatment, and to monitor the quality of this treatment. For this purpose, the batch of wafers (generally composed of twentyfive pieces) contains one "sample wafer" which is examined on termination of each process step. Depending on the treatment and on the conditions under which the treatment is carried out, this wafer is placed either at the ends of the batch or in a central position therein.

Finally, two batches of wafers subjected to different process steps are often combined before proceeding to further treatment. This is done by inserting into a single boat the two wafer batches taken from other boats, or by inserting into the single boat a batch of wafers taken from a different support, after extracting from said boat a number of wafers equal to the number to be inserted.

These operations are usually carried out in special environments, generally environments in which the wafers are permanently exposed to a laminar air flow to prevent dust particles being able to reach the wafers and soil them, with resultant obvious known problems.

Various types of robots or robotized systems are commercially available for implementing all the said operations.

These robots have however considerable drawbacks. In this respect, said robotized systems can handle only one or a small number of wafers at a time, and are often unable to remove with a single movement more than one of several wafers located for example in alternate positions or otherwise spaced apart. In addition, said systems are often not able to change the position of the wafers in a single boat, this being required during the execution of certain treatments. Finally, the presence of an arm or member for moving the robot within the laminar air flow creates turbulence, and this can cause dust particles to settle on the wafers, with obvious problems.

An object of the present invention is therefore to provide a wafer gripping and handling member, advantageously associated with a robot arm, which obviates the drawbacks of the state of the art.

A particular object of the present invention is to provide a wafer gripping and handling member which, when required, enables one or more wafers, even if distanced from each other, to be extracted by a single movement of the robot arm.

A further object is to enable that or those particular wafers requiring to be viewed or to undergo different treatment to be extracted from a boat.

A further object is to enable the wafer or wafers to be handled without any disturbance to the laminar air flow to which the wafer or wafers are exposed.

These and further objects which will be apparent to the expert of the art are attained by a gripper for the advantageously robotized handling of at least one silicon wafer, characterised by comprising a part which allows the gripper to be secured to an operating arm or other handling member, said part being rigid with a support structure for the wafers, said structure comprising at least two mutually cooperating opposing jaws mobile relative to each other, said jaws being provided with at least one seat for adapting them to the shape of the lateral edge of the wafer supported by said jaws during its handling.

The present invention will be more apparent from the accompanying drawing, which is provided by way of non-limiting example and in which.

Figure 1:
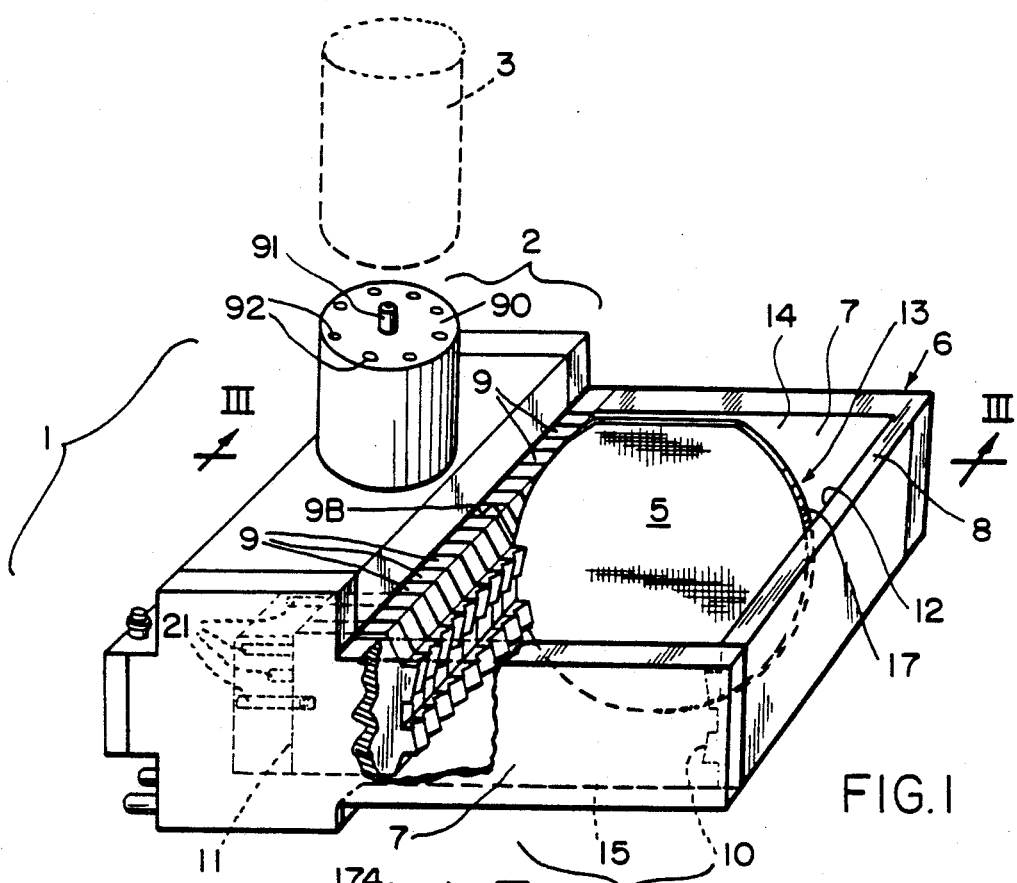
FIG. 1 is a perspective view of the gripper of the invention during a stage in its use.
Figure 2:
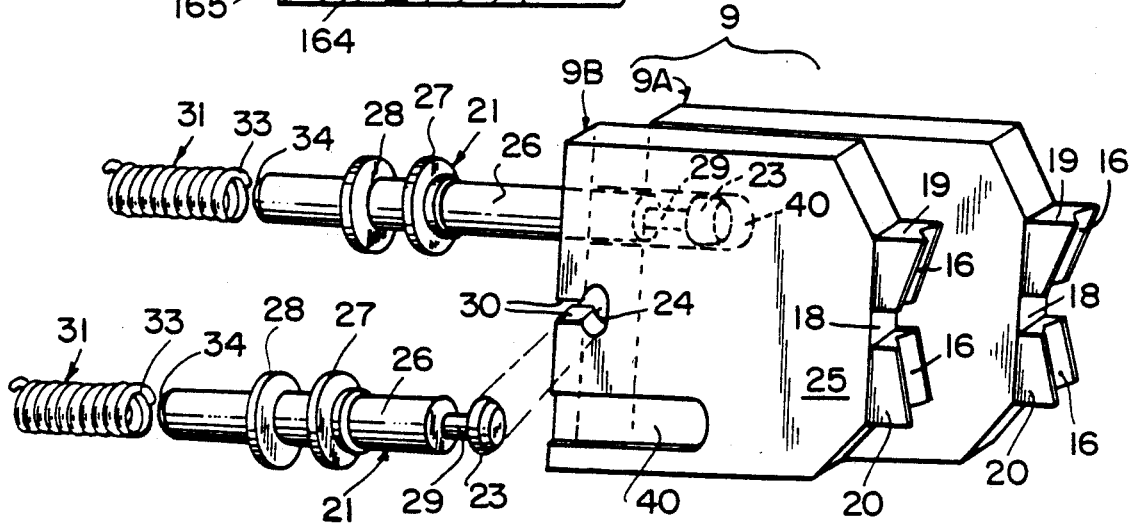
FIG. 2 is a perspective view of parts of the gripper of FIG. 1.
Figure 3:
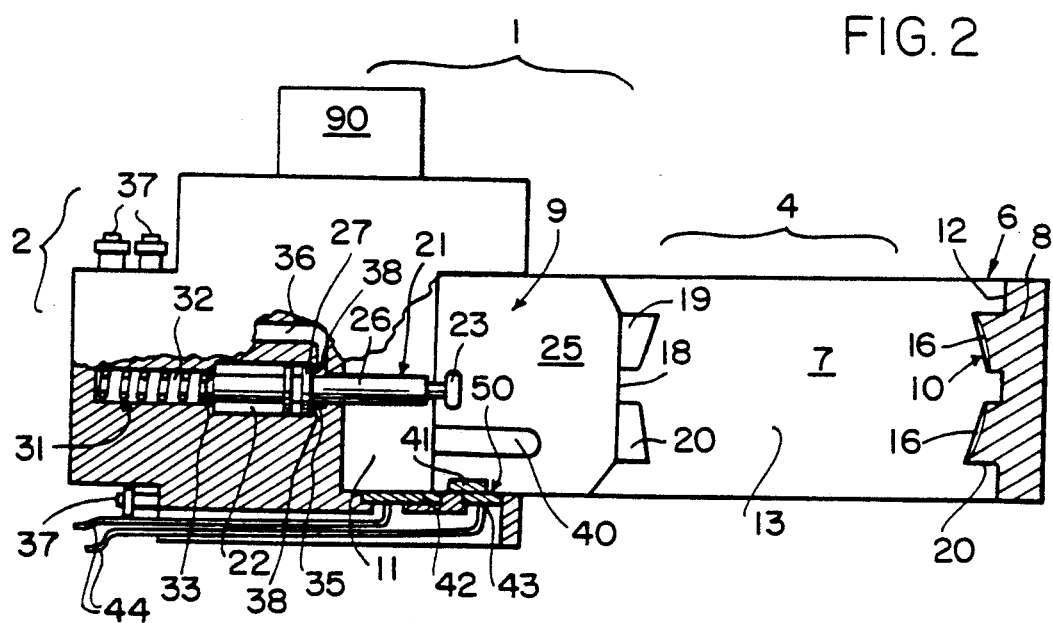
FIG. 3 is a section on the line III—III of FIG. 1.

In FIGS. 1 to 3, the gripper according to the present invention is indicated overall by the reference numeral 1 and comprises a part 2 to enable said gripper to be secured to an operating arm 3, for example of a robot or other handling member. The gripper 1 also comprises a structure 4 for supporting the wafers 5 (of which only one is shown in FIG. 1) and consisting of a frame 6 defined by arms 7 projecting perpendicularly from the part 2 and a cross-member 8 connecting said arms together.

The wafer support structure 4 (hereinafter called the support structure) comprises at least two opposing jaws 9 and 10 which cooperate with each other to support the wafers and are mobile relative to each other. Specifically, FIG. 1 shows a gripper 1 with a plurality of (for example twenty-five) mutually adjacent jaws 9 and 10; the jaws 9 are mobile in a seat 11 formed in the part 2 of the gripper 1, whereas the jaws 10 are fixed and rigid with that side 12 of the cross-member 8 of the support structure 4 which faces the interior of the frame 6, which defines a chamber or compartment 13 open on two opposing sides 14, 15 and in which the wafers are disposed during their handling.

Each jaw 9 and 10 comprises a seat 16 of a shape corresponding to that of the lateral edge 17 of the wafer supported by said jaws 9 and 10 during its handling. Said seat 16 can be formed directly in that edge 18 of each jaw which faces the chamber 13, or can be formed in mutually superposed parts 19 and 20 which are rigid with and project from said edge 18.

Figure 6:
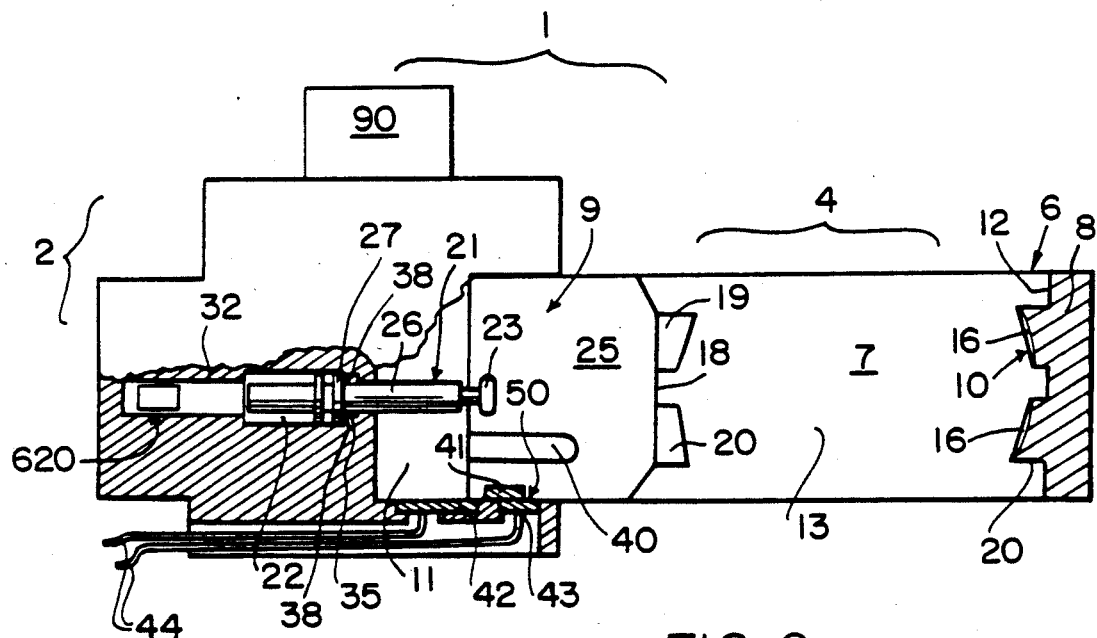
FIG. 6 is a section view along line III—III of FIG. 1 showing another embodiment with electromagnetic means.

Each mobile jaw 9 is subjected to the action of at least one actuator means represented by a piston 21 which is mobile within a seat 22 in the part 2 of the gripper 1 under the action of a pressurized fluid (such as air), as in the arrangement shown in FIG. 3, or by electromagnetic means 620, as shown in FIG. 6. The movement of the piston 21 in the seat 22 results in a guided movement of the jaw in the seat 11.

Specifically, each piston 21 comprises a head 23 arranged to cooperate with a seat 24 provided in the body 25 of each mobile jaw 9, and a rod 26 on which there is positioned a collar 27 and a seal member such as an O-ring. Between the rod 26 and the head 23 there is a recess 29 arranged to cooperate with opposing projections 30 provided at the mouth of the seat 24 in the body 25 of the jaw 9; this cooperation plus the cooperation between said head 23 and the wall of the seat 24 together provide the (axial) connection between the piston 21 and mobile jaw 9.

As stated, each piston 21 moves in a seat 22 provided in the part 2 of the gripper 1. This movement takes place against a compression spring 31 housed in a seat 32 and acting with one end 33 against the end 34 of the rod 26 of the piston 21. The seat 32 in which the spring 31 is located is a continuation of the seat 22 in which the piston 21 moves. The seat 22 comprises a variable-volume part or chamber 35 of smaller cross-section than the remaining part or chamber of said seat 22, into which a duct 36 opens for feeding pressurized fluid which acts on the collar 27 of the piston 21 to cause it to move against the spring 31. This duct extends to the outside of the part 2 of the gripper, where there is located a normal valve 37, such as a three-way or other valving member, for its connection to usual pressurized fluid delivery means and for discharging the fluid contained in the chamber 22 when the mobile jaw returns towards the chamber 13. The various valves 37 can be replaced by solenoid valves inserted into the part 2 of the gripper 1.

Between the chamber 35 and the remaining part of the seat 22 there is a step 38 arranged to cooperate with the collar 27 and to act as a stop for the movement of the piston 21 when, the pressurized fluid having been discharged from the chamber 35, said piston is subjected to the thrust of the spring 31.

The pistons associated with the various mobile jaws 9 are positioned in different planes. To enable each jaw 9 to move without the pistons 21 of adjacent jaws creating an obstacle, said jaws (see FIG. 2) are provided with grooves 40 in the side of their body 25. The grooves 40 partially accommodate the pistons 21 of adjacent jaws and also act as guides for the movement of the jaws 9. In particular, it can be seen in FIG. 2 that the piston of one (9A) of said jaws cooperates with the groove 40 of the jaw 9B which has moved from its rest position, ie the position which said jaws 9 assume when the collars 27 of the pistons 21 reach their limiting position against the step 38 in the seat 22; this position corresponds to the maximum emergence of said mobile jaws from the seat 11 in the part 2 of the gripper 1.

The movement of the jaws 9 is controlled by sensors connected to a microprocessor circuit, or microprocessor (not shown), which advantageously also controls the pressurized fluid feed to the ducts 36 (or current to the electromagnets) when it is required to move the pistons 21 and thus the jaws 9.

Specifically, said sensors monitor the attainment of the end-of-travel positions of the jaws and the attainment of the position of engagement with the wafer 5. Proximity sensors (optical, laser or the like) can also be positioned at suitable points on the frame 6 to detect whether the wafer 5 is present between the jaws 9 and 10 when it is required to handle the wafer.

One example of a sensor is indicated by 50 in FIG. 3. The sensor 50 is of the sliding contact type, comprising a part 41 rigid with the mobile jaw 9 and parts 42 and 43 rigid with the seat 11 in which this jaw moves. This type of sensor is particularly useful in determining whether engagement has taken place between the jaws 9 and 10 and the wafer 5. Two cables 44 extend from the parts or contacts of said sensor 50 to the aforesaid microprocessor to provide this latter with the position data regarding the jaw 9.

Figure 4:
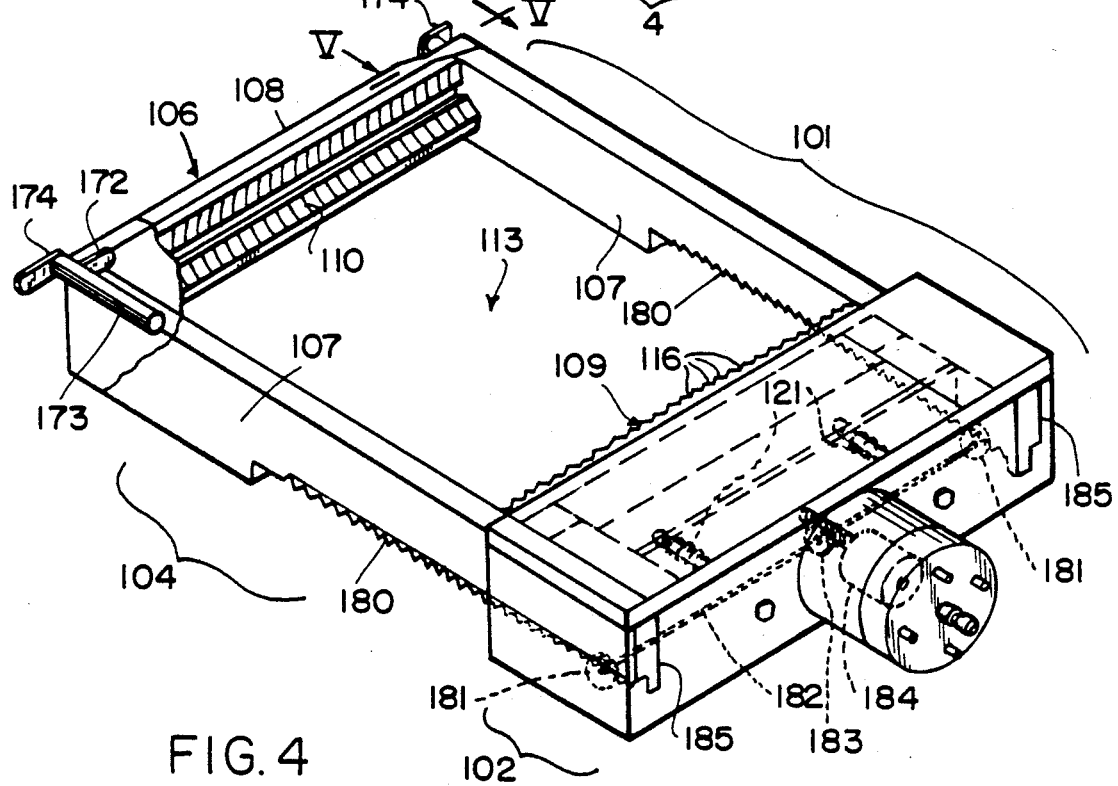
FIG. 4 is a perspective view of a modification of the gripper of FIG. 1.
Figure 5:
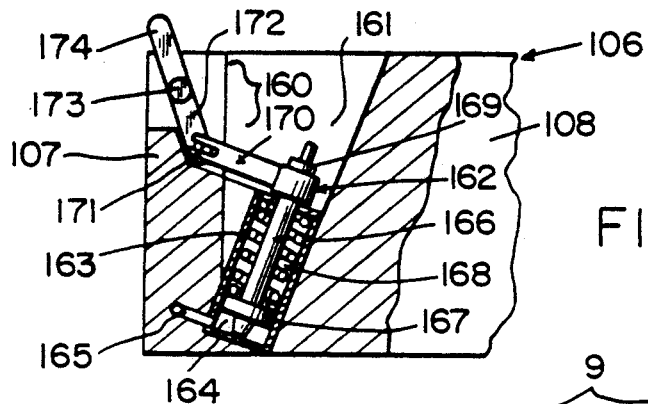
FIG. 5 is a partial section on the line V—V of FIG. 4.

FIGS. 4 and 5 show a modified embodiment of the gripper shown in FIGS. 1 to 3. In these figures, parts corresponding to those of FIGS. 1, 2 and 3 are indicated by the same reference numerals plus 100. In the figures under examination, the gripper 101 is provided with means 160 for handling the usual boats or devices which contain and support the wafers during the various stages of the process to which the silicon wafers are subjected. These means are housed in a seat 161 provided in the arms 107 of the frame 106 of the support structure 104 in proximity to the cross-member 108 which connects the arms 107 together, or in a seat 160 formed directly in said cross-member 108.

Figure 7:
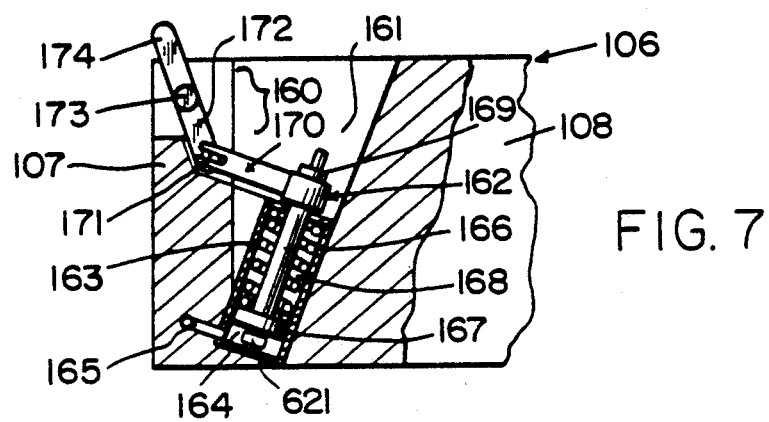
FIG. 7 is a partial section along line V—V of FIG. 4 showing another embodiment with electromagnetic means.

Specifically, said means each comprise a piston 162 mobile in a cylindrical seat 163 under the action of a pressurized fluid flowing into a variable-volume chamber 164 in the seat 163 through a duct 165 (or alternatively mobile electromagnetic means 621, best shown in FIG. 7). The piston 162 comprises a rod 166 provided with a collar 167 on one side of which there acts the pressurized fluid and on the other side a compression spring 168 contained in the seat 163 and embracing the rod 166.

A first arm 170 is secured to the head 169 of each piston 162. At its free end, this arm comprises a slot 171 arranged to receive a part 172 projecting from a pin 173. The pin 173 is positioned in a seat provided in the arms 107 of the frame 106 and comprises a further projecting part 174 arranged to cooperate with an appropriate slot in said boat.

As can be further seen from FIG. 4, in the modified embodiment of the gripper 1 of FIGS. 1 to 3, the arms 107 of the frame 106 of the support structure 104 comprise a rack 180 arranged to cooperate with gears 181 keyed onto a shaft 182 positioned within the part 102 of the gripper 101. On said shaft there is keyed a further gear 183 which is driven in any known manner by a direct current electric motor 184, advantageously of the stepping type. In this embodiment, by virtue of the cooperation between the gears 181 and the racks 180, the arms 107 are mobile relative to the part 102 of the gripper 101. By this means, when a boat is to be moved, the arms 107 are retracted by the mechanism comprising the motor 184, gears 181 and racks 180, into seats 185 provided in the part 102 of the gripper 101. Thus, as the boat carrying the wafers has a certain weight which can generate a moment tending to rotate the gripper 101, with obvious drawbacks, retracting the arms into said part 102 reduces the arm of said moment and thus its value, with consequent overcoming of the danger of rotation of the gripper 101.

FIG. 4 also shows a gripper 101 provided with a single mobile jaw 109 comprising a plurality of seats 116 for engaging the edges of the wafers. The jaw 19 is driven by actuator means 121 entirely similar to those described in relation to FIGS. 1 to 3, and are therefore not described here.

Both the movement of the actuator means 160 and 121 and the movement of the arms 107 are controlled advantageously by a single microprocessor circuit (not shown). Sensor means (optical, laser, sliding contact or the like) are also provided to determine whether engagement between the projecting parts 174 and the boat has occurred. The means provided to support the boat can obviously be different from those described heretofore, these likewise falling within the scope of the present invention (such as arms perpendicular to and projecting from the cross-member 108, and mobile under the action of pistons or other pressure-operated or electromagnetic means, the arms being guided in their movement by tracks provided in said cross-member).

Finally, with reference to FIG. 1, the part 2 of the gripper 1 comprises a cylindrical element 90 for securing the gripper to the robotized arm 3. Said element 90 comprises a centering pin 91 and holes 92 for engagement by usual screws for connecting the arm 2 to the gripper 1.

It will now be assumed that a particular step in a diffusion process is underway and it is required to move wafers from one boat to another.

The robotized arm 3 is firstly operated to position the gripper 1 above the boat from which determined wafers are to be extracted. By means of the microprocessor, which controls the execution of all stages in the handling of the wafers, the operator opens the gripper jaws. This is done by feeding pressurized fluid into the chambers 35 of the seats 22 for the pistons 21. This fluid acts on the collars 27 of said pistons to cause them to retract into their respective seats against the action of the springs 31. This movement of the pistons also causes all the mobile jaws 9 to move into the seats 11 provided in the part 2 of the gripper 1.

At this point the wafers are raised and extracted from the boat by known means and inserted into ythe chamber 13 of the support structure 4. During this operation the wafers are exposed to the air flow which penetrates into said chamber through the open sides 14 and 15. This prevents any dust particles settling on the wafers, and creating obvious problems.

Once the wafers are in the chamber 13, the suitably programmed microprocessor opens the valve 37 connected to the ducts 38 which lead into the chambers of the seats for the pistons associated with those jaws 9 located in the positions corresponding to the wafers to be moved from one boat to another. In this manner, said pistons 21, now no longer subjected to the action of the pressurized fluid but instead subjected to the thrust of the springs 31, move into the seats 22 and cause the corresponding jaws 9 to move out of their seats 11. Said mobile jaws 9 therefore thrust those wafers 5 to be moved into the other boat against the fixed jaws, and together with these they retain said wafers. The thrust action does not damage the wafers because the springs which effect the movement of the pistons and jaws are chosen so as to allow the jaws 9 to press against the silicon wafers only with sufficient force to retain them without damaging them.

At this point, the means which has raised the wafers and extracted them from the boat now return the wafers into this latter, and only those wafers retained by the jaws 9 and 10 remain in the gripper 1. By a further signal the microprocessor opens all the valves 37 to discharge from the ducts 36 the fluid still present in them, to enable all the jaws 9 not engaging a wafer to return to their rest position. A further microprocessor command moves the robotized arm 3 and brings the gripper 1 above the other boat into which the wafers retained by the jaws 9 and 10 are to be inserted. Above this latter boat (at which the known wafer raising and extracting means have already been positioned to receive the handled wafers), those jaws 9 and 10 which do not contain wafers are firstly opened in the manner heretofore decribed, after which the gripper 1 is lowered to move the handled wafers to within a short distance from said raising means, and finally the remaining jaws 9 and 10 are opened in the said manner and the wafers retained by them are released onto said raising means. These latter then insert into that boat the wafers withdrawn by the gripper 1 from the other boat.

It should be noted that after the wafers have been gripped by the gripper, it is not necessary to release all those jaws not engaged with wafers, because in any event the mobile jaws 9 not engaging such wafers must be returned to the seats 11 before positioning the gripper above the second boat. This is to enable any wafers already present in this latter and raised from it by the raising means to be received in the chamber 13 of the support structure 4 when the gripper has been positioned above the second boat. With the described device it is possible to remove from a boat either an entire batch of wafers (generally twentyfive in number), or just one of such wafers, or any finite number of them even if in non-adjacent positions.

The use of a gripper 1 provided with a number of mobile jaws (as shown i FIG. 1) has been described, the use of the gripper 101 shown in FIG. 4 and provided with a single mobile jaw comprising a suitable number of seats 16 for cooperating with the wafer edges being based on the same reasoning (but is not described).

Using the gripper 101 constructed in accordance with the modified embodiment shown in FIG. 4 it is also possible to move a boat carrying wafers. To attain this, the cross-member 108 of the frame 106 of the support structure 104 is moved up to said boat. Having done this, the suitably programmed microprocessor feeds pressurized fluid through the ducts 165 and into the chambers 164 of the seats 163 carrying the pistons 162, to move these latter in a manner analogous to that previously described for the pistons 21. The movement of the pistons 162 causes the arms 170 rigid with them to move and rotate the pins 173 in their seats in the arms 107 of the frame 106 by virtue of the action of the arms 170 on the projecting parts 172. With the rotation of the pins 173, the projecting parts 174 of these pins become positioned projecting from and perpendicular to the cross-member 108. At this point, with the projecting parts projecting perpendicular to the cross-member 108, the gripper is made to further approach the boat so that said projecting parts move under the usual projecting edges of the boat. This having been done, the microprocessor opens the valves (not shown in the figures) connected to the ducts 165, so as to release the pressure in the chambers 164 and enable the springs 168 to return the collar 167 of each piston 162 to its lowered position within the seat 163 (as shown i FIG. 5). This collar movement results in re-entry of the piston 162 into the seat 163 and the consequent return of the projecting part 174 of each piston into the raised position, with this latter engaging the boat. The boat will then rest with its lower edge on the cross-member 108, so that it cannot lose its engagement by the projecting parts 174. Furthermore, as stated, to prevent excessive stressing of the connection between the gripper 101 and the robotized arm, which derives from the moment generated by the boat constrained to the frame 106, the arms 107 of said frame are retracted into the seats 185 in the part 102 of the gripper 101 by the action of the gears 181, driven by the elecrric motor 184, on the rack 180.

the boat is released from the gripper 101 by feeding pressurized fluid into the seats 163 for the pistons 162, which causes them to move within said seats and consequently lower the projecting parts 174. When the boat has been deposited in the required position it is released into this position by withdrawing the gripper 101. The exact positioning of the wafers within the frame 6, 106 and the movement of the jaws 9, 109 and arms 107 are controlled by the microprocessor through sensors. For example, by means of the sliding contact sensor 50 the exact position of each jaw 9 cooperating with a wafer 5 can be verified during its handling. Specifically, only when in a certain position (the engagement position) is a signal fed to the microprocessor, whereas in the other positions there is no signal. In this manner it is possible to check whether the jaw 9 (and the jaw 10) has engaged the wafers.

With a gripper constructed in accordance with the invention any required number of wafers can be handled with programmed handling. In addition the gripper movement does not interrupt the air flow to which the wafers are exposed.

We claim:

1. A gripper for robotized handling of a silicon wafer holder, comprising:
   a) a part;
   b) a handling means secured to said part; and
   c) a wafer support structure, said wafer support structure being rigid with said part, and comprising,
      1) at least two mutually cooperating opposing jaws being mobile relative to each other, each of said jaws being provided with at least one seat for adapting said jaws to the shape of the lateral edge of the silicon wafers supported by said jaws, and
      2) on at least one side of said wafer support structure, at least two wafer holder support members mobile relative to said one side and arranged to cooperate with said silicon wafer holder to enable the silicon wafer holder to be supported and handled, said wafer holder support members operated by actuator means driven against elastic means, said actuator means being controlled by a microprocessor circuit, there being provided sensor means connected to said microprocessor circuit to sense when engagement between said wafer holder support members and said silicon wafer has taken place, said actuator means comprising pistons with heads, said pistons mobile in a cylindrical seat and carrying, rigid with their heads, arms which engage projecting parts of pins, said pins being located in seats provided in a frame of the gripper, said pins carrying further projecting parts which define the members for supporting the silicon wafer holder.

2. A gripper as claimed in claim 1, wherein said pistons are driven pnuematically.

3. A gripper as claimed in claim 1, wherein said pistons are driven electromagnetically.

4. A gripper for robotized handling of at least one silicon wafer having a lateral edge, comprising:
   a) a part;
   b) a handling member secured to said part; and
   c) a wafer support structure, said wafer support structure being rigid with said part, and comprising,
      1) a series of adjacent mobile jaws having sides,
      2) a series of adjacent fixed jaws corresponding in number to said adjacent mobile jaws, said mobile jaws being moveable relative to said fixed jaws to support said silicon wafer,
      3) a number of actuator means corresponding in number to said mobile jaws, one of each said actuator means engaging with one of each of said mobile jaws, said actuatir means engaging with one each of said mobile jaws, said actuator means driving each mobile jaw relative to said fixed jaws,
      4) elastic means against which each said mobile jaws move, wherein said actuator means comprise pistons engaged at different points on the sides of said mobile jaws, and wherein the side of said mobile jaws are provided with recesses where the adjacent pistons are engaged with adjcent mobile jaws, such that the pistons of each mobile jaw clear the recesses of adjacent mobile jaws.

5. A gripper as claimed in claim 4, wherein each of said actuator means is driven pneumatically.

6. A gripper as claimed in claim 4, wherein each of said actuator means is driven electromagnetically.

7. A gripper for robotize handling of at least one silicon wafer having a lateral edge comprising:
   a) a part;
   b) a handling member secured to said part; and
   c) a wafer support structure, said wafer support structure being rigid with said part and comprising,
      1) at least two mutually cooperating opposing jaws mobile relative to each otehr, said jaws being provided with at least one seat for adapting said jaws to the shape of the lateral edge of the silicon wafer supported by said jaws, one of said opposing jaws being a mobile jaw and the opposing jaw being a fixed jaw,
      2) a substantially quadrilateral frame, one side of which defined by said part, said quadrilateral frame defining a chamber where the wafers are placed during their handling, said chamber being of variable volume,
      3) means to move said one side of said frame nearest the fixed jaws relative to side carrying the mobile jaws, said means comprising arms joining said side of frame carrying the fixed jaws and side of frame carrying the mobile jaws, said arms providing with a rack, said rack cooperating with gears keyed onto a shaft rotated by a direct current electric motor of stepping type, said electric motor being rigidly attached to said gripper.

* * * * *